(12) United States Patent
Machida et al.

(10) Patent No.: US 7,521,283 B2
(45) Date of Patent: Apr. 21, 2009

(54) MANUFACTURING METHOD OF CHIP INTEGRATED SUBSTRATE

(75) Inventors: Yoshihiro Machida, Nagano (JP); Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 470 days.

(21) Appl. No.: 11/257,717

(22) Filed: Oct. 25, 2005

(65) Prior Publication Data
US 2006/0121718 A1 Jun. 8, 2006

(30) Foreign Application Priority Data
Dec. 7, 2004 (JP) ............... 2004-354172

(51) Int. Cl.
*H01L 21/00* (2006.01)
(52) U.S. Cl. .............. 438/106; 438/108; 438/109; 438/127; 257/E23.001
(58) Field of Classification Search .......... 438/106, 438/108, 109, 127
See application file for complete search history.

(56) References Cited

U.S. PATENT DOCUMENTS

| | | | |
|---|---|---|---|
| 6,489,685 B2 * | 12/2002 | Asahi et al. .......... | 257/774 |
| 6,689,639 B2 * | 2/2004 | Sakuyama et al. .......... | 438/118 |
| 6,734,542 B2 * | 5/2004 | Nakatani et al. .......... | 257/687 |
| 7,180,169 B2 * | 2/2007 | Ishimaru et al. .......... | 257/690 |
| 2003/0085058 A1 | 5/2003 | Komatsu et al. | |
| 2003/0227077 A1 | 12/2003 | Towle et al. | |
| 2004/0195691 A1 | 10/2004 | Moriyasu et al. | |

FOREIGN PATENT DOCUMENTS

| | | |
|---|---|---|
| EP | 1304742 | 4/2003 |
| JP | 2002-170921 | 6/2002 |
| JP | 2004 165277 | 6/2004 |
| JP | 2004-31178 | 11/2004 |
| JP | 2004-311788 | 11/2004 |
| JP | 2004-319848 | 11/2004 |

\* cited by examiner

*Primary Examiner*—Michael Trinh
(74) *Attorney, Agent, or Firm*—Ladas & Parry LLP

(57) ABSTRACT

A manufacturing method of a chip integrated substrate is disclosed. The manufacturing method includes a first step that forms a wiring structure to be connected to a semiconductor chip on a first core substrate; a second step that disposes the semiconductor chip on a second core substrate; and a third step that bonds the first core substrate on which the wiring structure is formed to the second core substrate on which the semiconductor chip is disposed. In addition, the manufacturing method includes a step that removes the first core substrate after the third step and a step that removes the second core substrate after the third step.

10 Claims, 13 Drawing Sheets

MANUFACTURING METHOD OF CHIP INTEGRATED SUBSTRATE

BACKGROUND OF THE INVENTION

1. Field of the Invention

The present invention generally relates to a manufacturing method of a chip integrated substrate in which a semiconductor chip is integrated on a substrate.

2. Description of the Related Art

At present, a high performance electronic instrument using semiconductor devices such as semiconductor chips has been developed, and in a case where a semiconductor chip is mounted on a substrate, a high density mounting is required. In addition, a small-sized substrate with a reserved area on which the semiconductor chip is mounted is required.

In order to meet these requests, a so-called chip integrated substrate in which a semiconductor chip is embedded in a substrate has been proposed, and various structures for integrating the semiconductor chip on the substrate have been proposed.

For example, in a case where a chip integrated substrate is formed, wiring to be connected to the semiconductor chip must be formed. As a method to form the wiring on the semiconductor chip, for example, a method in which an insulation layer is formed on the semiconductor chip, multi-layer insulation layers are laminated if necessary, and the wiring is formed on the insulation layer, has been used widely.

In this case, for example, when the wiring is formed on the semiconductor chip, via wiring for penetrating the insulation layer must be formed; for example, via holes are formed by using a laser, and the via wirings are formed in the via holes. This method has been used (refer to Patent Document 1).

[Patent Document 1] Japanese Laid-Open Patent Application No. 2004-165277 (refer to paragraph 0051, FIG. 5)

However, when the via holes are formed in the insulation layer, a so-called de-smearing process being a later process after forming the via holes is required, that is, a chemical treatment process is needed; therefore, there are problems in that the processes become complex and the cost increases.

In addition, in a case where the chip integrated substrate is formed as a thin type, for example, bowing of the substrate occurs and there is a problem in that its manufacturing becomes difficult. For example, when thermo-hardening insulation layers are laminated on a semiconductor chip and a thermo-hardening process is applied to each of the insulation layers, stresses of the multi-layer insulation layers are accumulated; therefore, it is difficult to avoid a problem that the bowing of the substrate becomes large, and there is a limit to manufacturing a thin type substrate.

SUMMARY OF THE INVENTION

It is a general object of the present invention to provide a manufacturing method of a chip integrated substrate being novel and useful that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a manufacturing method of a chip integrated substrate particularly pointed out in the specification in such full, clear, concise, and exact terms as to enable a person having ordinary skill in the art to practice the invention.

According to one aspect of the present invention, in order to achieve the above object, there is provided a manufacturing method of a chip integrated substrate in which a semiconductor chip is integrated. The manufacturing method includes a first step that forms a wiring structure to be connected to the semiconductor chip on a first core substrate; a second step that disposes the semiconductor chip on a second core substrate; and a third step that bonds the first core substrate on which the wiring structure is formed to the second core substrate on which the semiconductor chip is disposed.

According to the manufacturing method of the present invention, a thin chip integrated substrate can be manufactured at a low cost.

In addition, when the manufacturing method further includes a step that removes the first core substrate after the third step, the chip integrated substrate can be made thinner.

In addition, when the manufacturing method further includes a step that removes the second core substrate after the third step, the chip integrated substrate can be made much thinner.

In addition, when the first step includes a step that forms conductive layers on the first core substrate and a step that forms plural plug wirings which are connected to corresponding parts of one of the conductive layers, the wiring structure can be formed by a simple method.

In addition, in the third step, when electrode pads of the semiconductor chip and one of the plural plug wirings are pressed together and are electrically connected, the wiring structure and the semiconductor chip can be connected by a simple method.

In addition, when solder layers or stud bumps are formed between the electrode pads and corresponding parts of one of the plural plug wirings, the certainty of the connection between the electrode pads and the corresponding parts of the one of the plural plug wirings can be improved.

In addition, since the plural plug wirings include first plug wirings which are pressed by the electrode pads and second plug wirings whose height is greater than that of the first plug wirings, a chip integrated substrate that has connecting sections to outside terminals formed on both sides can be formed by a simple method.

In addition, since the manufacturing method further includes a step that applies patterning to one of the conductive layers after the third step, the wiring structure can be formed by a simple method, and this is preferable.

In addition, when the manufacturing method further includes a step that laminates an insulation layer on the first core substrate or the second core substrate before the third step, the insulation layer can be formed between the first core substrate and the second core substrate.

In addition, when the manufacturing method further includes a step that applies an underfill material as a coating on the first core substrate before the third step, the underfill material can fill in between the semiconductor chip and the wiring structure.

In addition, when the semiconductor chip is disposed on the second core substrate via a chip height adjusting layer, the wiring structure with connections to outside terminals on both sides can be easily formed, which is preferable.

In addition, when the manufacturing method further includes a step that forms first terminal connecting sections on corresponding parts of one of the conductive layers and second terminal connecting sections on the second plug wirings via a plating layer in order that the wiring structure is electrically connected to outside terminals, the chip integrated substrate can connect to the outside terminals from the both sides, which is preferable.

According to the present invention, the manufacturing method of the chip integrated substrate whose thickness is small can be provided at a low cost.

Other objects and further features of the present invention will become apparent from the following detailed description when read in conjunction with the accompanying drawings.

DESCRIPTION OF THE PREFERRED EMBODIMENTS

In the following, embodiments of the present invention will be described with reference to the accompanying drawings.

First Embodiment

Figure 1A:
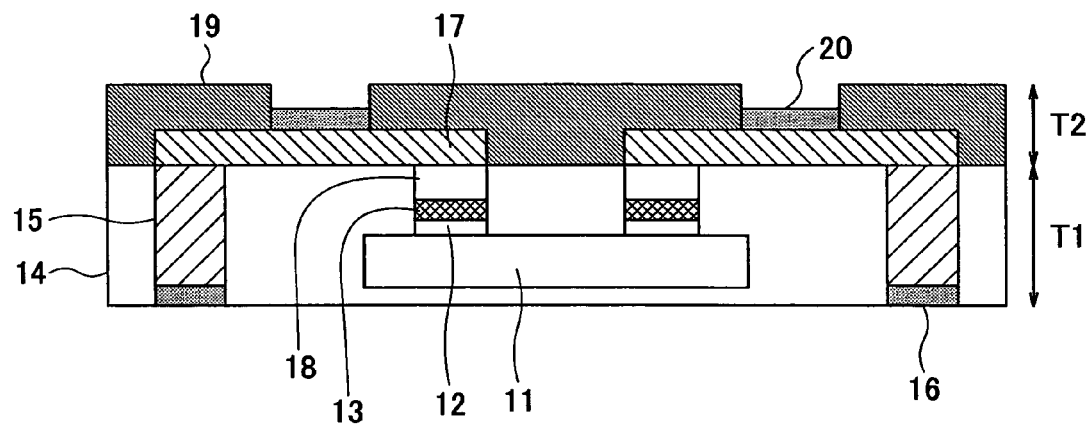
FIG. 1A is a schematic cross-sectional view of a chip integrated substrate according to a first embodiment of the present invention.

FIG. 1A is a schematic cross-sectional view of a chip integrated substrate in which a semiconductor chip is integrated on a substrate according to a first embodiment of the present invention.

As shown in FIG. 1A, a chip integrated substrate 10 according to the first embodiment has a structure in which a semiconductor chip 11 is embedded in an insulation layer 14 made of, for example, a resin such as a polyimide resin and an epoxy resin. On electrode pads 12 formed on the semiconductor chip 11, plug wirings 18 made of, for example, Cu are formed in a standing up state, and in order to make good electric connections between the electrode pads 12 and the plug wirings 18, for example, solder layers 13 are formed. In addition, in order to make good electric connections, the electrode pad 12 can include Ni formed by an aluminum zincate material.

In addition, the plug wiring 18 is electrically connected to wiring 17 made of, for example, Cu, patterned on the insulation layer 14. Further, the wiring 17 is connected to plug wiring 15 made of, for example, Cu, formed in the insulation layer 14 in a manner so that the plug wiring 15 penetrates the insulation layer 14.

In addition, a solder resist layer 19 is formed in a manner so that the solder resist layer 19 covers the insulation layer 14 and the wirings 17, and plating layers 20 made of Ni/Au are formed on the wirings 17 at opening parts of the solder resist layer 19 in a manner so that the plating layers 20 can connect to outside terminals.

In addition, on the other end of the plug wiring 15 which penetrates the insulation layer 14 and is connected to the wiring 17 on one end, a plating layer 16 made of Ni/Au is formed in a manner so that the plating layer 16 can connect to an outside terminal.

As mentioned above, in the chip integrated substrate 10 according to the first embodiment, terminal connecting sections, with which the semiconductor chip 11 is connected to outside terminals via a wiring structure, are formed on both surfaces being a first main surface and a second main surface, that is, the chip integrated substrate 10 has a structure in which the semiconductor chip 11 can be connected to the outside terminals at both surfaces of the substrate.

In addition, the thickness T1 of the insulation layer 14 is, for example, approximately 70 μm, the thickness T2 of the solder resist layer 19 is, for example, approximately 30 μm, and the total thickness, that is, the thickness of the chip integrated substrate 10 according to the first embodiment is approximately 100 μm and is less than a conventional CSP (chip size package) structure. That is, there is a strong point in the manufacturing method of the chip integrated substrate 10 according to the first embodiment. In the manufacturing method of the chip integrated substrate 10 according to the first embodiment, the wiring structure composed of wirings such as the plug wirings 15 and 18 which are connected to the semiconductor chip 11 is formed separately from the semiconductor chip 11, and the wiring structure is bonded to the semiconductor chip 11.

Therefore, according to the first embodiment, there is an advantage in that the package structure (chip integrated substrate) can be formed thinner, compared with a conventional method, for example, in which wiring is formed on a semiconductor chip by laminating. Further, there is an effect that the manufacturing cost is reduced. These are explained in detail later by using the drawings from FIG. 2A on.

Figure 1B:
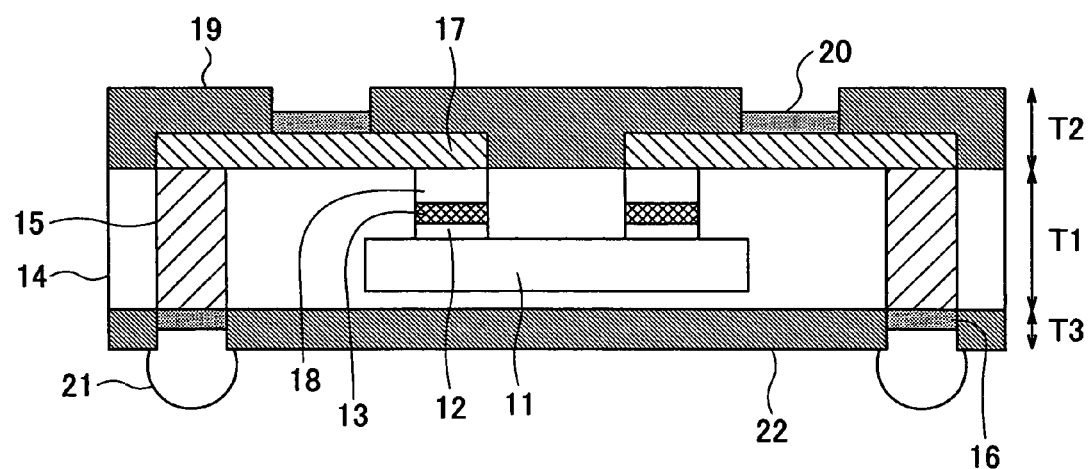
FIG. 1B is a schematic cross-sectional view of a modified example of the chip integrated substrate according to the first embodiment of the present invention.

In addition, the chip integrated substrate 10 shown in FIG. 1A can be modified to, for example, a chip integrated substrate 10A shown in FIG. 1B. In FIG. 1B, the same reference numbers are attached to the same elements explained above and the same explanations are omitted.

As shown in FIG. 1B, in the chip integrated substrate 10A, a solder resist layer 22 is formed on the opposite side of the insulation layer 14 from where the solder resist layer 19 is formed. In addition, the plating layers 16 are formed at opening parts of the solder resist layer 22, and solder bumps 21 are formed on the plating layers 16. In this way, if necessary, the terminal connecting sections and the connecting structure of wiring can be modified suitably.

Next, the manufacturing method of the chip integrated substrate according to the first embodiment is explained in detail.

The outline of the manufacturing method of the chip integrated substrate according to the first embodiment is as follows. First, a wiring structure such as plug wiring to be connected to a semiconductor chip is formed on a core substrate. On the other hand, a semiconductor chip is mounted on a different core substrate. Further, both the core substrates are bonded in a manner so that the wiring structure on the core substrate and the semiconductor chip on the different core substrate face each other. With this, the wiring structure and the semiconductor chip are bonded. After this, both the core substrates are removed.

Therefore, it is possible that the chip integrated substrate be formed thinner, compared with a conventional one. Further, it is not necessary that the via holes be formed by a laser which is used in the conventional one; therefore, the chip integrated substrate can be manufactured at a low cost.

Next, referring to FIGS. 2A through 2F, FIGS. 3A through 3C, and FIGS. 4A through 4N, the manufacturing method of the chip integrated substrate according to the first embodiment is explained in detail by using the following processes.

First, FIGS. 2A through 2F are diagrams showing a method of forming a wiring structure on a core substrate.

Figure 2A:
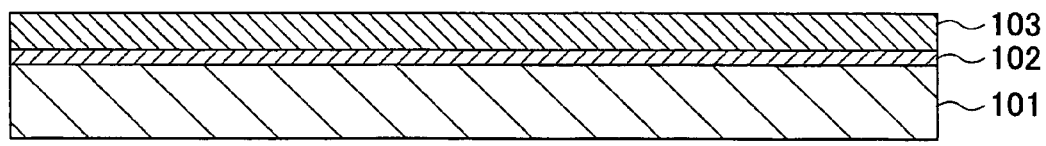
FIG. 2A is a diagram explaining a first process for forming a wiring structure according to the first embodiment.

As shown in FIG. 2A, first, a conductive layer 103 made of, for example, Cu, is formed by plaiting on a core substrate 101 made of, for example, a resin material. In this case, when a conductive layer 102 made of a Cu thin film made of, for example, Cu foil has been formed in advance, the conductive layer 103 can be easily formed on the conductive layer 102 by electrolytic plating, and this is preferable.

Figure 2B:
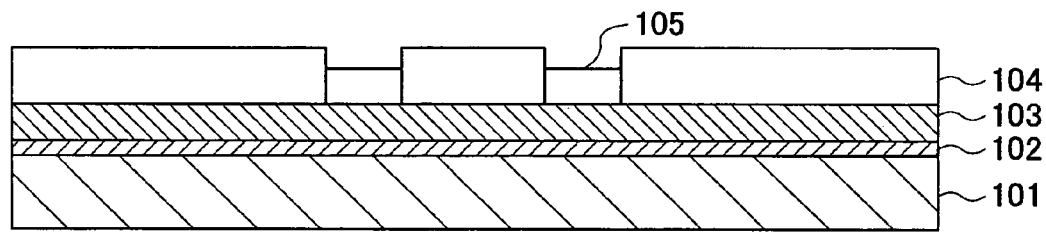
FIG. 2B is a diagram explaining a second process for forming the wiring structure according to the first embodiment.
Figure 2C:
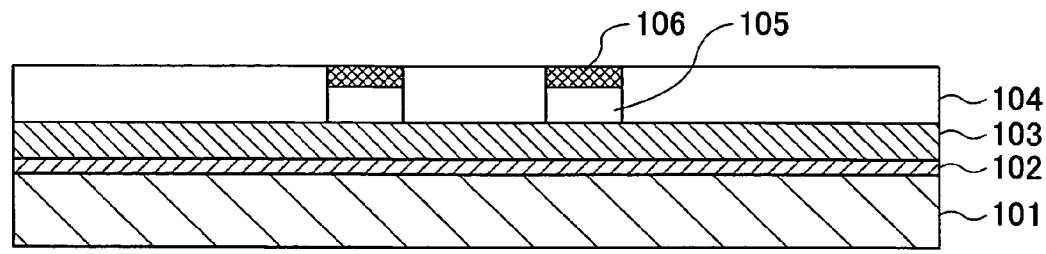
FIG. 2C is a diagram explaining a third process for forming the wiring structure according to the first embodiment.

Next, in a process shown in FIG. 2B, a resist layer 104 is formed on the conductive layer 103, patterning is applied to the resist layer 104, and plug wirings 105 made of, for example, Cu, to be electrically connected to the conductive layer 103, are formed at opening parts of the resist layer 104 by plating. In this case, since the plug wirings 105 are electrically connected to electrode pads of a semiconductor chip later by pressing, as shown in FIG. 2C, when solder layers 106 are formed on the plug wirings 105 by using, for example, a printing method, electrical connections between the plug wirings 105 and the electrode pads become excellent, this is preferable.

Figure 2D:
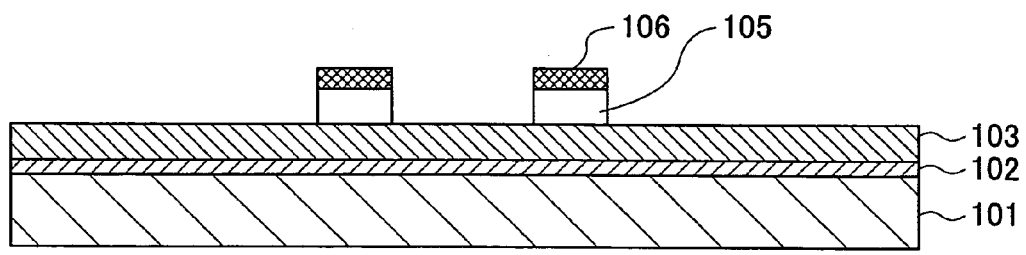
FIG. 2D is a diagram explaining a fourth process for forming the wiring structure according to the first embodiment.
Figure 2E:
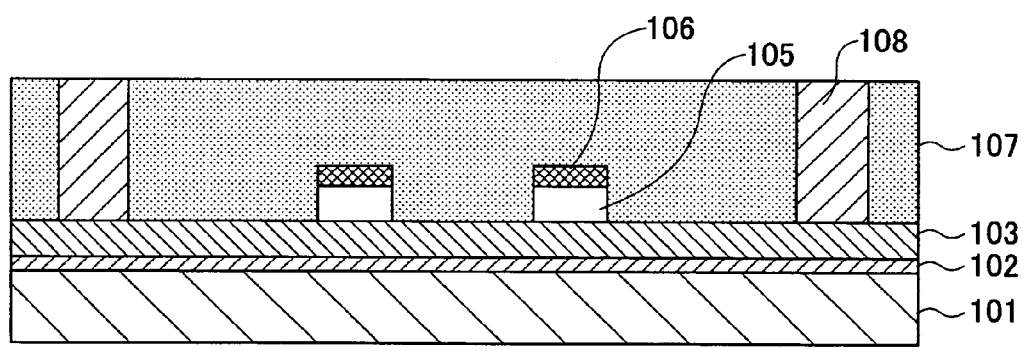
FIG. 2E is a diagram explaining a fifth process for forming the wiring structure according to the first embodiment.

Next, in a process shown in FIG. 2D, after removing the resist layer 104, in a process shown in FIG. 2E, a resist layer 107 is formed, patterning is applied to the resist layer 107, and plug wirings 108 made of, for example, Cu, to be electrically connected to the conductive layer 103, are formed at opening parts of the resist layer 107 by plating. In this case, the height of the plug wiring 108 is formed greater than that of the plug wiring 105. This comes from the following reason. At a later process, the plug wiring 105 is connected to the electrode pad of the semiconductor chip; however, the plug wiring 108 is formed in a manner so that the plug wiring 108 penetrates an insulation layer in which a semiconductor chip of a chip integrated substrate is embedded.

Figure 2F:
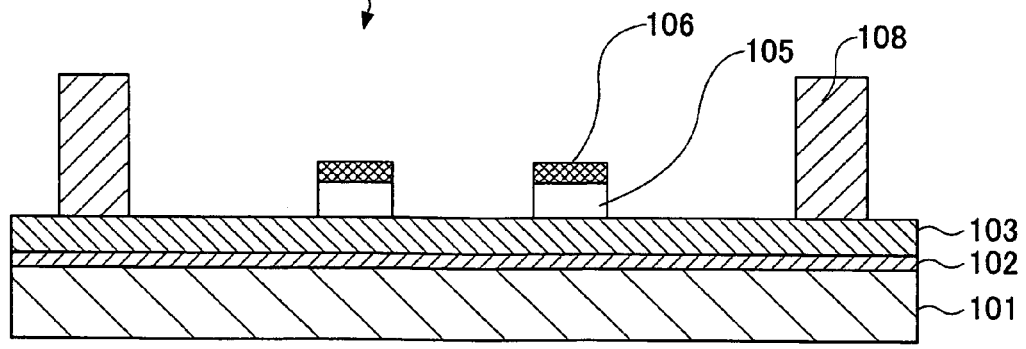
FIG. 2F is a diagram explaining a sixth process for forming the wiring structure according to the first embodiment.

Next, in a process shown in FIG. 2F, the resist layer 107 is removed, and a wiring structure formed substrate 100, in which the wiring structure including the plug wirings 105 and 108 are formed, is formed.

Figure 3A:
FIG. 3A is a diagram explaining a first process for forming a chip disposed substrate according to the first embodiment.
Figure 3B:
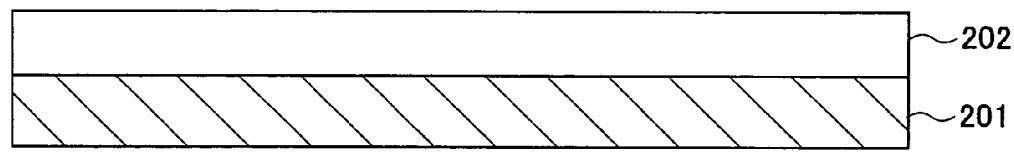
FIG. 3B is a diagram explaining a second process for forming the chip disposed substrate according to the first embodiment.
Figure 3C:
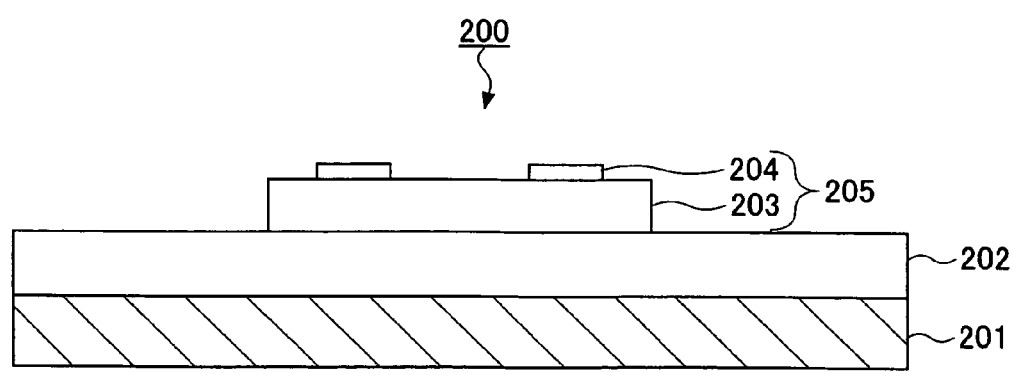
FIG. 3C is a diagram explaining a third process for forming the chip disposed substrate according to the first embodiment.

On the other hand, a semiconductor chip disposed substrate, in which a semiconductor chip is disposed on a substrate, is formed by processes shown in FIGS. 3A through 3C.

First, in a process shown in FIG. 3A, a core substrate 201 made of, for example, a resin material, is prepared.

Next, in a process shown in FIG. 3B, in order to adjust the disposing height of the semiconductor chip which is disposed in a later process, a chip height adjusting layer 202 is formed on the core substrate 201. When the wiring structure and the semiconductor chip are bonded in the later process, since the solder layers 106 are surely pressed onto the semiconductor chip and the plug wirings 108 have a position relation so that the plug wirings 108 penetrate through the insulation layer containing the semiconductor chip, the chip height adjusting layer 202 adjusts the height of the semiconductor chip. That is, when pressure is applied to the semiconductor chip via the plug wirings 105 and the solder layers 106 in a later bonding process, the chip height adjusting layer 202 is suitably deformed by being compressed and the plug wirings 108 are suitably positioned to penetrate through the insulation layer while the solder layers 106 and the semiconductor chip maintain the electric connection.

The chip height adjusting layer 202 can be made of, for example, an insulation material such as an epoxy resin and a polyimide resin, and it is desirable that the material be able to be suitably deformed elastically.

Next, in a process shown in FIG. 3C, a semiconductor chip 205, which provides a chip main body 203 and electrode pads 204 formed on the chip main body 203, is disposed on the chip height adjusting layer 202. In this case, when the electrode pads 204 have a structure including a Ni bump, formed by, for example, an aluminum zincate material, its electric connection becomes good. This is preferable. By the above processes, a semiconductor chip disposed substrate 200 having a structure in which the semiconductor chip 205 is disposed on the core substrate 201 via the chip height adjusting layer 202, is formed.

Figure 4A:
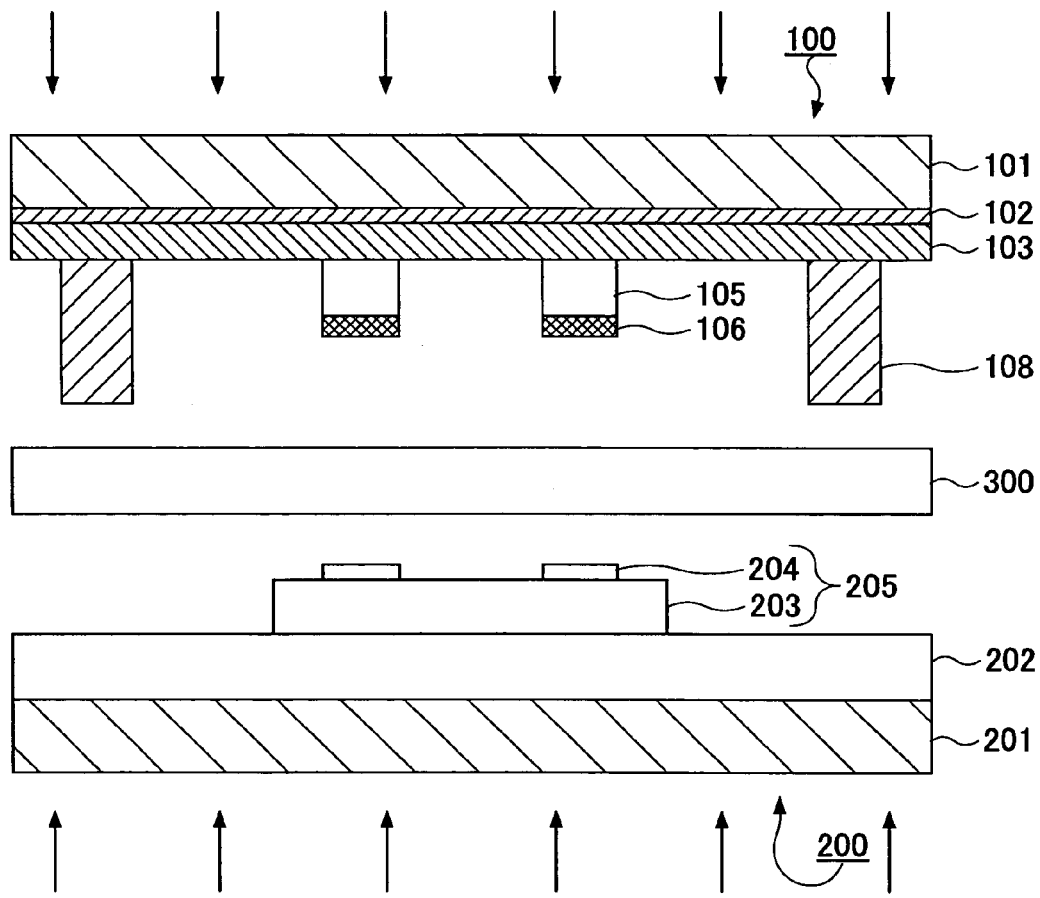
FIG. 4A is a diagram explaining a first process for forming the chip integrated substrate according to the first embodiment.
Figure 4B:
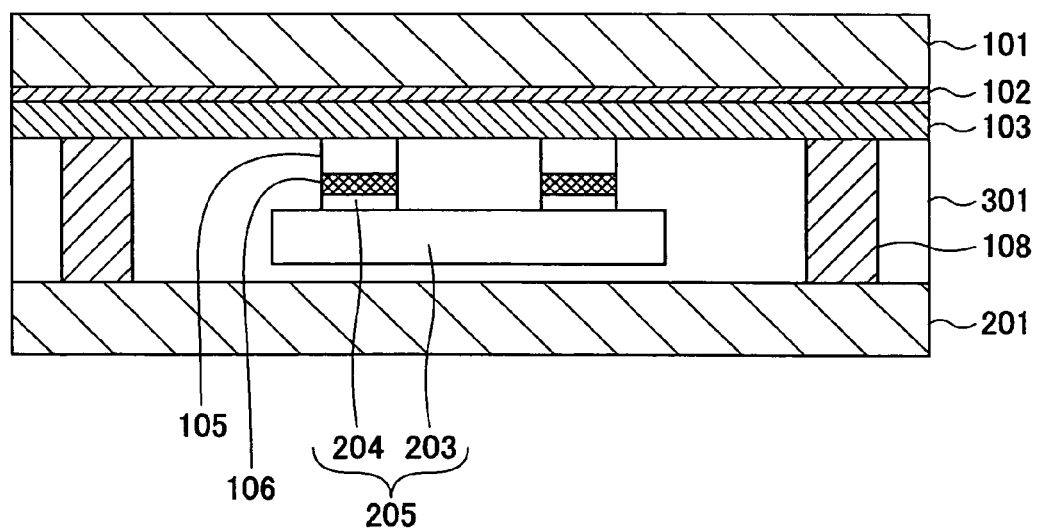
FIG. 4B is a diagram explaining a second process for forming the chip integrated substrate according to the first embodiment.
Figure 4C:
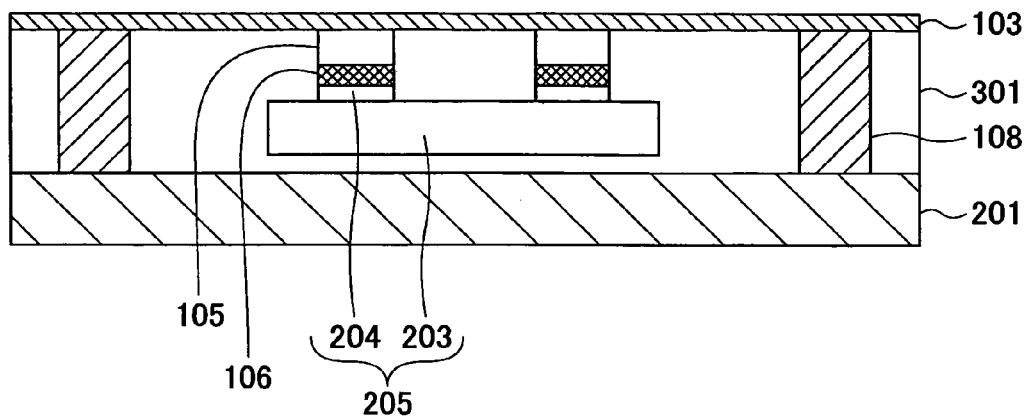
FIG. 4C is a diagram explaining a third process for forming the chip integrated substrate according to the first embodiment.
Figure 4D:
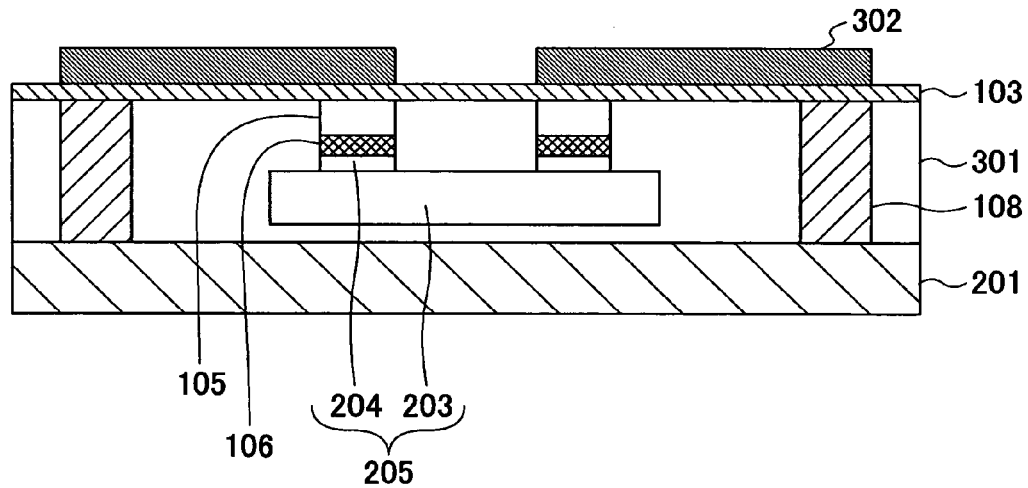
FIG. 4D is a diagram explaining a fourth process for forming the chip integrated substrate according to the first embodiment.
Figure 4E:
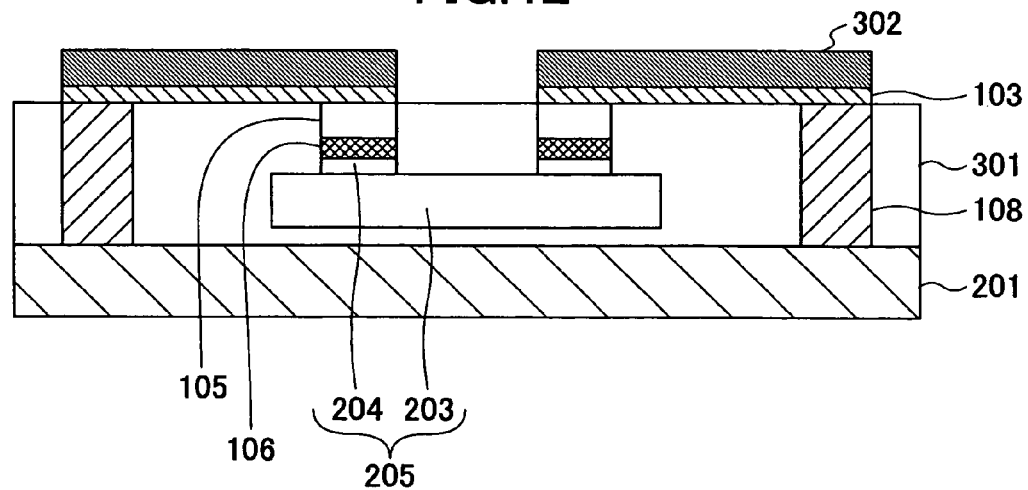
FIG. 4E is a diagram explaining a fifth process for forming the chip integrated substrate according to the first embodiment.
Figure 4F:
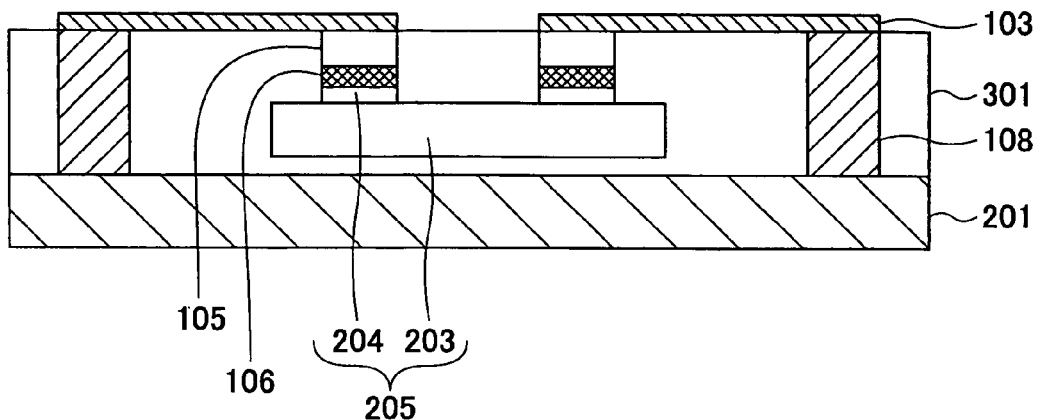
FIG. 4F is a diagram explaining a sixth process for forming the chip integrated substrate according to the first embodiment.
Figure 4G:
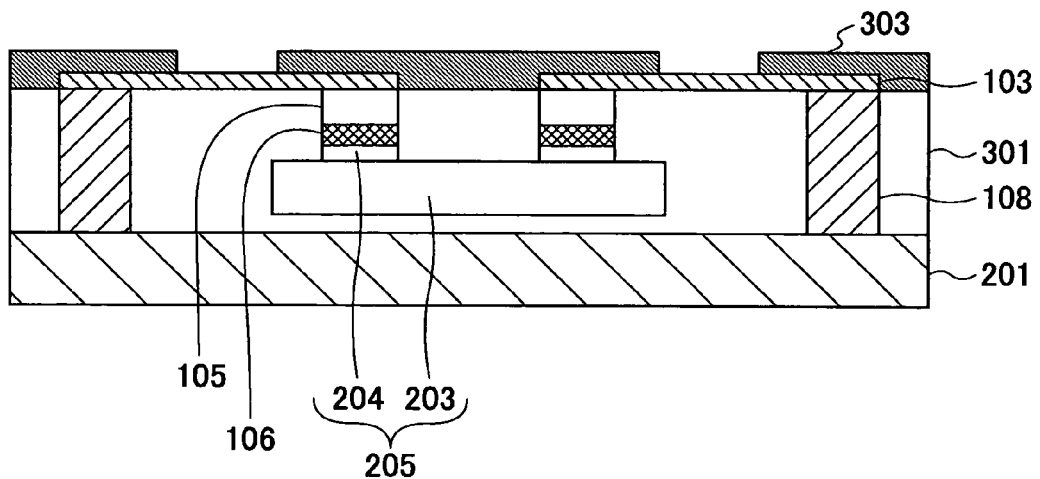
FIG. 4G is a diagram explaining a seventh process for forming the chip integrated substrate according to the first embodiment.
Figure 4H:
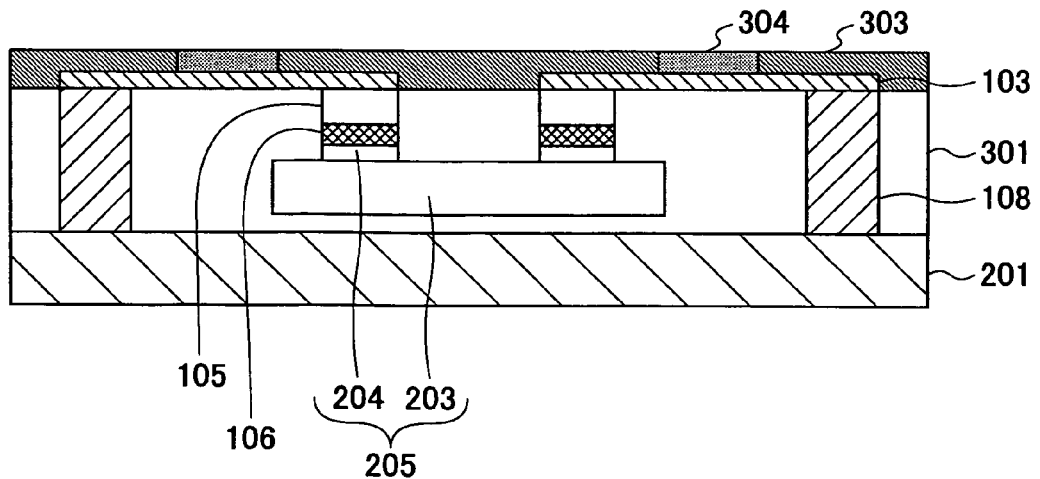
FIG. 4H is a diagram explaining an eighth process for forming the chip integrated substrate according to the first embodiment.
Figure 4I:
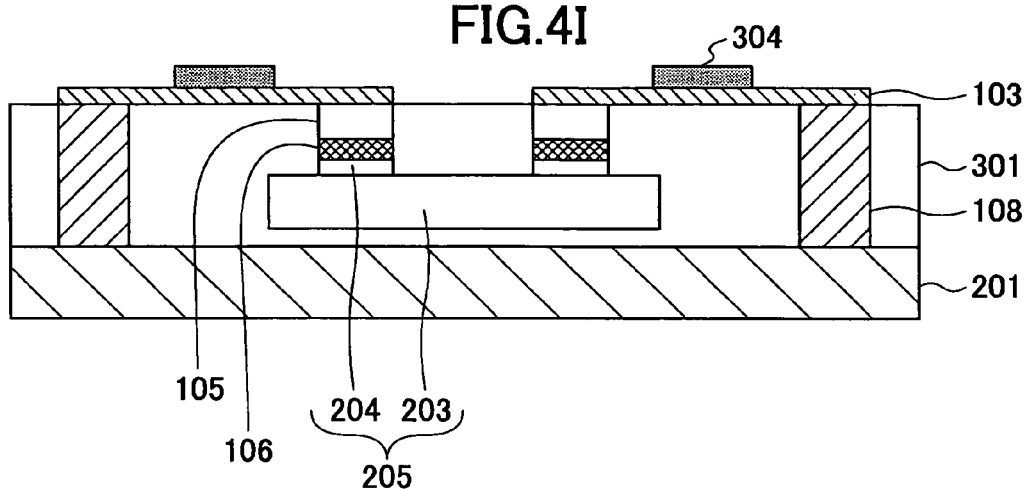
FIG. 4I is a diagram explaining a ninth process for forming the chip integrated substrate according to the first embodiment.
Figure 4J:
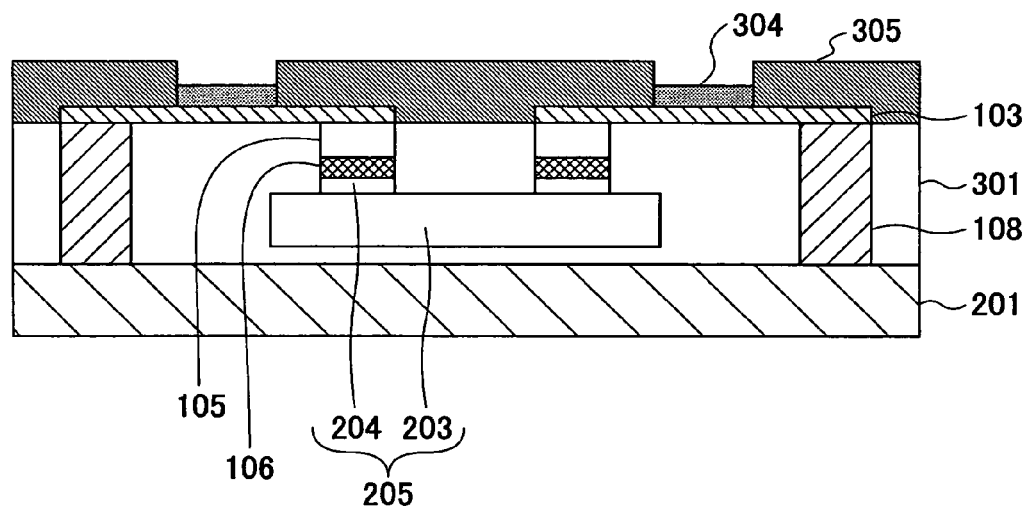
FIG. 4J is a diagram explaining a tenth process for forming the chip integrated substrate according to the first embodiment.
Figure 4K:
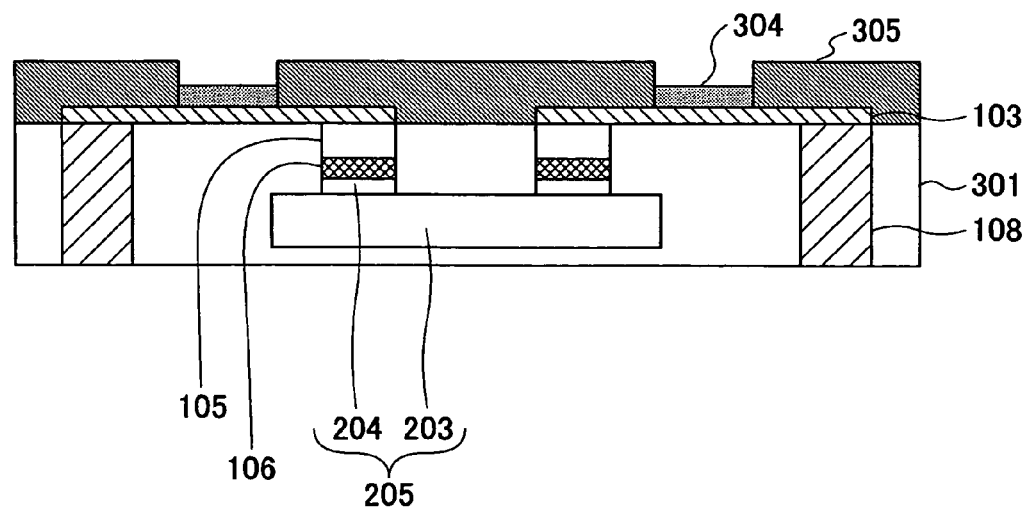
FIG. 4K is a diagram explaining an eleventh process for forming the chip integrated substrate according to the first embodiment.
Figure 4L:
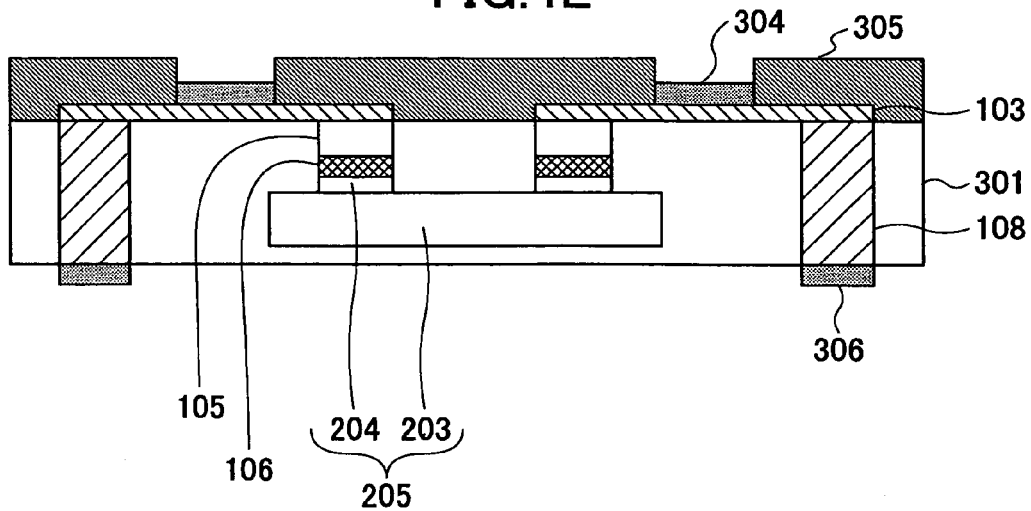
FIG. 4L is a diagram explaining a twelfth process for forming the chip integrated substrate according to the first embodiment.
Figure 4M:
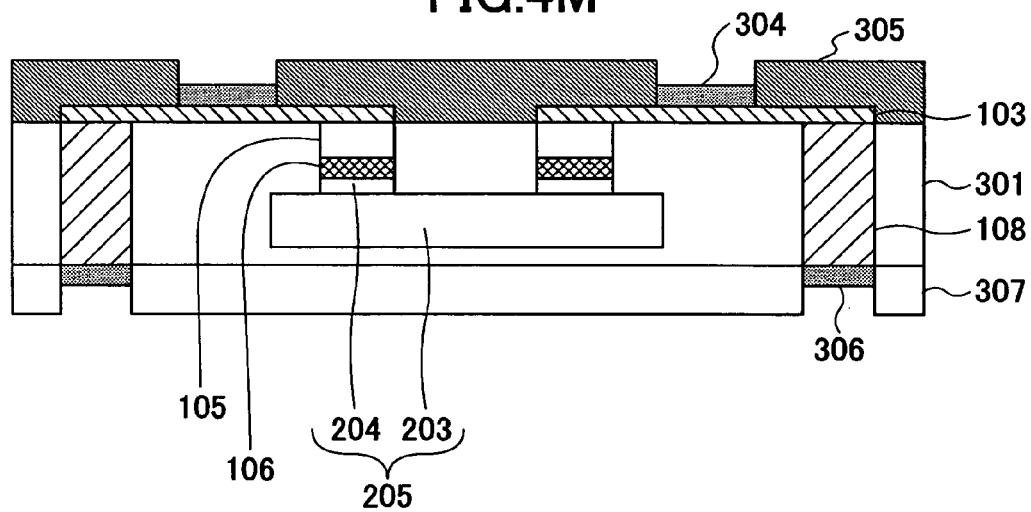
FIG. 4M is a diagram explaining a thirteenth process for forming the chip integrated substrate according to the first embodiment.
Figure 4N:
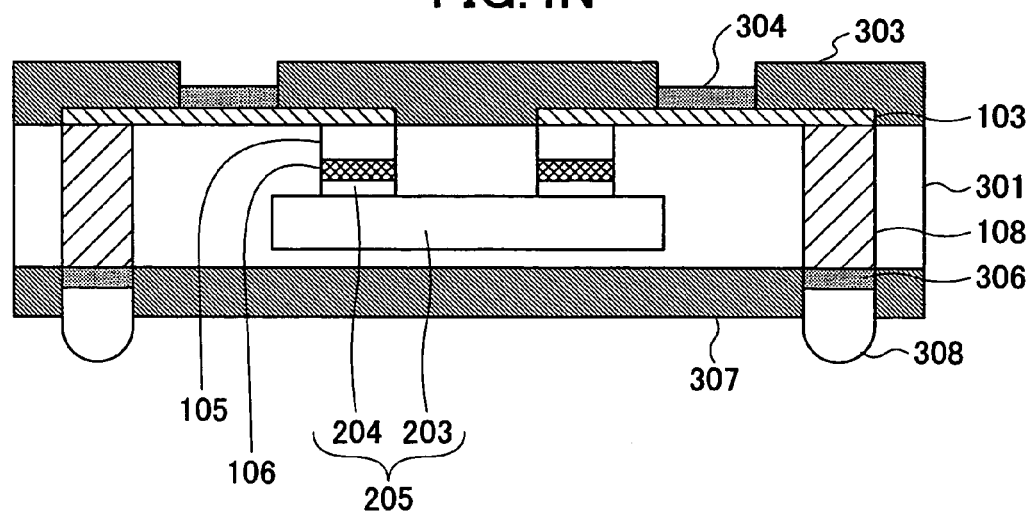
FIG. 4N is a diagram explaining a fourteenth process for forming the chip integrated substrate according to the first embodiment.

Next, in processes shown in FIGS. 4A through 4N, a chip integrated substrate is completed by bonding the wiring structure formed substrate 100 to the semiconductor chip disposed substrate 200, executing further various processes if necessary.

First, in a process shown in FIG. 4A, the wiring structure formed substrate 100 and the semiconductor chip disposed substrate 200 are bonded. In this case, the wiring structure formed substrate 100 and the semiconductor chip disposed substrate 200 are bonded in a manner so that the wiring structure including the plug wirings 105 and 108 face the semiconductor chip 205 including the electrode pads 204 and pressure is applied thereto. In this case, the electrode pads 204 are connected to the plug wirings 105 by the pressure; specifically, the Ni bumps of the electrode pads 204 and the solder layers 106 of the plug wirings 105 are pressed together, the solder is fused at the time of resin thermo-hardening, and the Ni bumps of the electrode pads 204 and the solder layers 106 of the plug wirings 105 are connected.

In addition, before bonding the wiring structure formed substrate 100 and the semiconductor chip disposed substrate 200, it is desirable that an insulation layer 300 being film-shaped made of, for example, an epoxy resin or a polyimide resin, be laminated in a manner so that the insulation layer 300 covers the wiring structure on the core substrate 101 and the semiconductor chip 205 on the core substrate 201. In this case, the space between the wiring structure and the semiconductor chip 205 is filled with the insulation layer 300, then the insulation layer 300 functions as a so-called dielectric inter layer.

After bonding, as shown in FIG. 4B, an insulation layer 301 is formed by the insulation layer 300 and the chip height adjusting layer 202 being unified and becomes a dielectric inter layer formed around the semiconductor chip 205 and the wiring structure. Therefore, it is desirable that the same material be used for the insulation layer 300 and the chip height adjusting layer 202. In this case, the ends of the plug wirings 108 extending away from the conductive layer 103 are formed to engage the core substrate 201.

In addition, it is desirable that the insulation layer 301 be formed by using, for example, a hardening resin such as a thermohardening resin, and the insulation layer 301 be hardened by heat treatment at a suitable process after the process shown in FIG. 4B. In this case, since the chip integrated substrate according to the first embodiment is formed by bonding, the insulation layer is a single layer and has a strong point that bowing caused by thermohardening is small. For example, when the insulation layer 301 is formed by laminating multi-layers, plural heating processes are required, and in some cases, the bowing of the substrate becomes large. However, by the method according to the first embodiment, this problem can be avoided, its structure is simple compared with the conventional one, and the bowing caused by the heating can be restrained.

Next, in a process shown in FIG. 4C, the core substrate 101 is removed by, for example, a buff polishing method. In this case, the conductive layer 102 is also removed, the polishing is applied to the conductive layer 103, and the thickness of the conductive layer 103 is adjusted to a required thickness.

Next, in a process shown in FIG. 4D, a resist layer is formed on the polished conductive layer 103, patterning is applied to the resist layer, and a resist pattern 302 is formed.

Next, in a process shown in FIG. 4E, the conductive layer 103 at a part being not covered with the resist pattern 302 is removed by etching, and in a process shown in FIG. 4F, the resist pattern 302 is removed. By the above processes, wirings which connect from the semiconductor chip 205 to the plug wirings 105 and to the plug wirings 108 via the conductive layer 103 are formed.

Next, in a process shown in FIG. 4G, a resist layer is formed to cover the insulation layer 301 and the conductive layer 103, patterning is applied to the resist layer, and a resist pattern 303 having opening parts at suitable positions of the conductive layer 103 is formed. Next, in a process shown in FIG. 4H, plating layers 304 made of, for example, Ni/Au are formed in the opening parts so that the semiconductor chip 205 can be connected to outside terminals, and in a process shown in FIG. 4I, the resist pattern 303 is removed.

Next, in a process shown in FIG. 4J, a solder resist layer is formed to cover the insulation layer 301 and the conductive layer 103, patterning is applied to the solder resist layer, and opening parts are formed to expose the plating layers 304; by this, a solder resist layer 305 is formed.

Next, in a process shown in FIG. 4K, the core substrate 201 is removed by, for example, a buff polishing method.

As mentioned above, in the chip integrated substrate according to the first embodiment, in the process shown in FIG. 4K and in the process shown in FIG. 4C, the core substrates 101 and 201 are removed; therefore, the chip integrated substrate can be made thinner. One of the reasons that the core substrates 101 and 201 can be removed is as follows. The insulation layer (dielectric inter layer) is a single layer created by the bonding process, due to this, the bowing of the insulation layer is restrained, and the bowing can be restrained even when the core substrates being supporting layers are removed. In addition, in the processes forming the chip integrated substrate, since core substrates made of the same material are provided at both sides of the insulation layer at the time when heating for thermohardening is applied to the insulation layer, mismatching of the thermal expansion coefficients can be avoided. Further, if necessary, it is possible that a structure having both the core substrates be used; alternately, a structure which has either the core substrate 101 or the core substrate 201 can be used.

Next, in a process shown in FIG. 4L, for example, similar to the processes shown in FIGS. 4G through 4I, plating layers 306 made of, for example, Ni/Au are formed on the plug wirings 108 at the ends extending away from the conductive layer 103 so that the semiconductor chip 205 can be connected to outside terminals. With this, the chip integrated substrate is completed.

If necessary, processes shown in FIGS. 4M and 4N are executed.

In a process shown in FIG. 4M, a solder resist layer is formed to cover the insulation layer 301, patterning is applied to the solder resist layer, and opening parts are formed to expose the plating layers 306. By this, a solder resist layer 307 is formed.

In a process shown in FIG. 4N, for example, solder balls 308 are formed on the plating layers 306. By this, a structure in which the semiconductor chip 205 can easily be connected to a connecting object, for example, a mother board and so on, is realized.

In addition, in the manufacturing method of the chip integrated substrate according to the first embodiment, a so-called laser via process for forming via holes in the insulation layer by using a laser is not required. Therefore, a de-smearing process using a chemical liquid after the laser via process is not required, the manufacturing processes for forming the chip integrated substrate become simple, and the manufacturing cost can be reduced. These effects can be obtained.

In addition, in the conventional technology, when the wiring and the insulation layer are formed by laminating, in some cases, there is a problem in that the adhesiveness between the insulation layer made of, for example, a resin material and the wiring formed by plating is weak. On the other hand, according to the manufacturing method of the first embodiment, since the insulation layer and the wiring are bonded by pressure, the adhesion strength between the wiring formed by a plating method and the insulation layer is greater compared with the conventional technology, the separation of the wiring and the insulation layer is restrained, and the reliability of the wiring structure is improved. These effects can be obtained.

Second Embodiment

The manufacturing method of the chip integrated substrate according to the present invention is not limited to the above-mentioned first embodiment, and modifications and variations can be applied to the first embodiment. Next, referring to FIGS. 5A through 5F, FIGS. 6A through 6D, and FIGS. 7A and 7B, a manufacturing method of a chip integrated substrate according to a second embodiment is explained in detail by using the following processes. In the following diagrams, each of the elements explained in the first embodiment has the same reference number and the same explanation is omitted. Further, in the following, sections where a specific explanation is not provided are the same as those in the first embodiment.

First, FIGS. 5A through 5F are diagrams showing a method of forming a wiring structure on a core substrate.

Figure 5A:
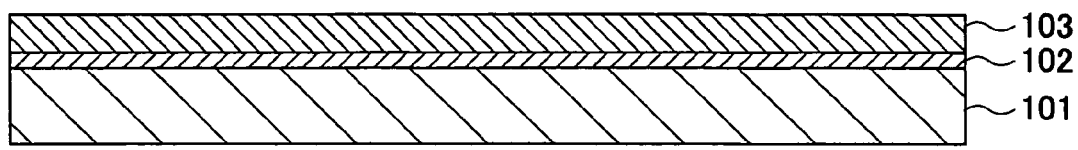
FIG. 5A is a diagram explaining a first process for forming a wiring structure according to a second embodiment of the present invention.
Figure 5B:
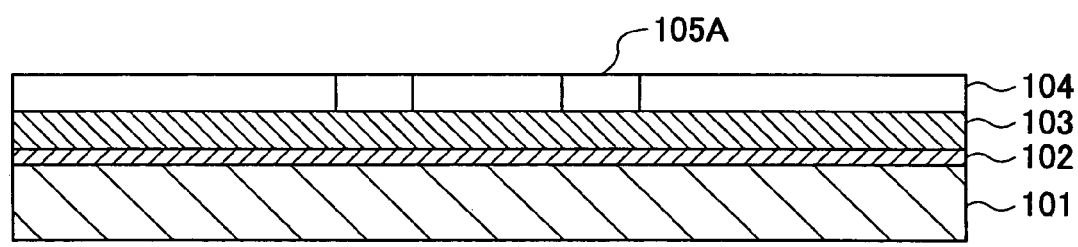
FIG. 5B is a diagram explaining a second process for forming the wiring structure according to the second embodiment.
Figure 5C:
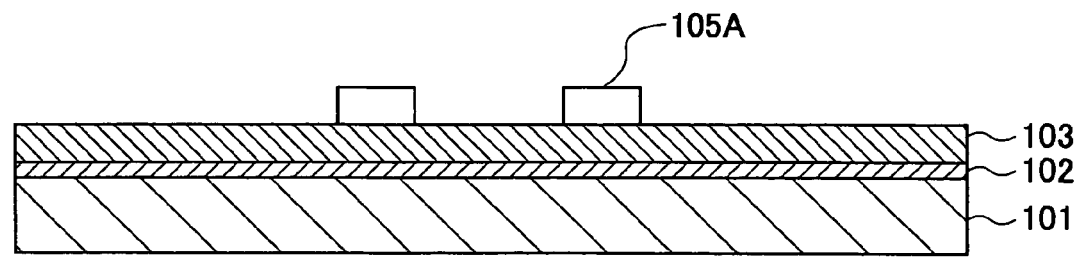
FIG. 5C is a diagram explaining a third process for forming the wiring structure according to the second embodiment.

A process shown in FIG. 5A is the same as the process shown in FIG. 2A. Next, in a process shown in FIG. 5B, a resist layer 104 is formed on a conductive layer 103, patterning is applied to the resist layer 104, plug wirings 105A made of, for example, Cu, are formed at opening parts of the resist layer 104 by plating, and in a process shown in FIG. 5C, the resist layer 104 is removed. In the second embodiment, as is different from the first embodiment, solder layers are not formed on the plug wirings 105A. In the second embodiment, a structure corresponding to the solder layers 106 in the first embodiment, in which the electric connection between the plug wiring and the semiconductor chip is made good, is formed in the side of the semiconductor chip. This is explained later.

Figure 5D:
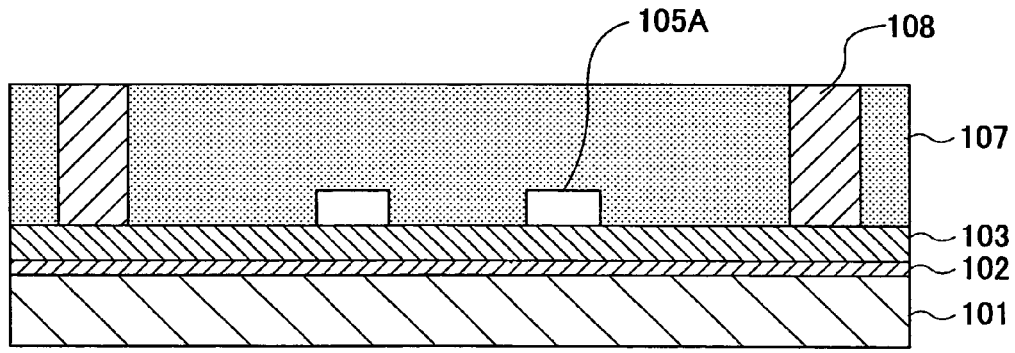
FIG. 5D is a diagram explaining a fourth process for forming the wiring structure according to the second embodiment.
Figure 5E:
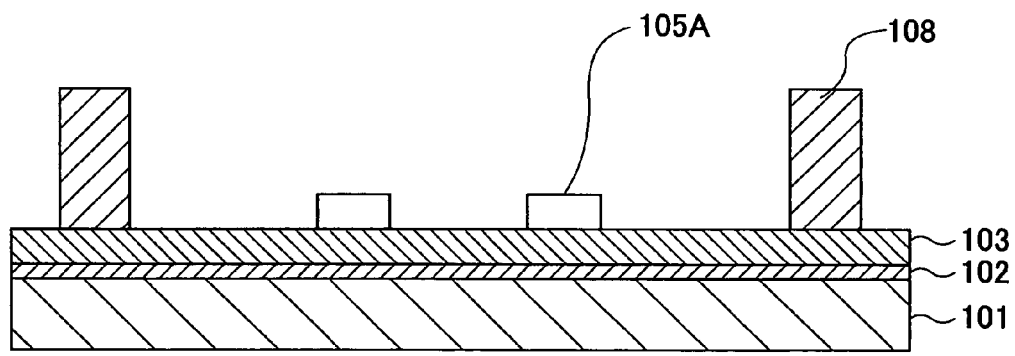
FIG. 5E is a diagram explaining a fifth process for forming the wiring structure according to the second embodiment.

Next, in a process shown in FIG. 5D, a resist layer 107 is formed and patterning is applied to the resist layer 107. Then plug wirings 108 made of, for example, Cu, to be electrically connected to a conductive layer 103, are formed at opening parts of the resist layer 107 by plating. Next, in a process shown in FIG. 5E, the resist layer is removed.

Figure 5F:
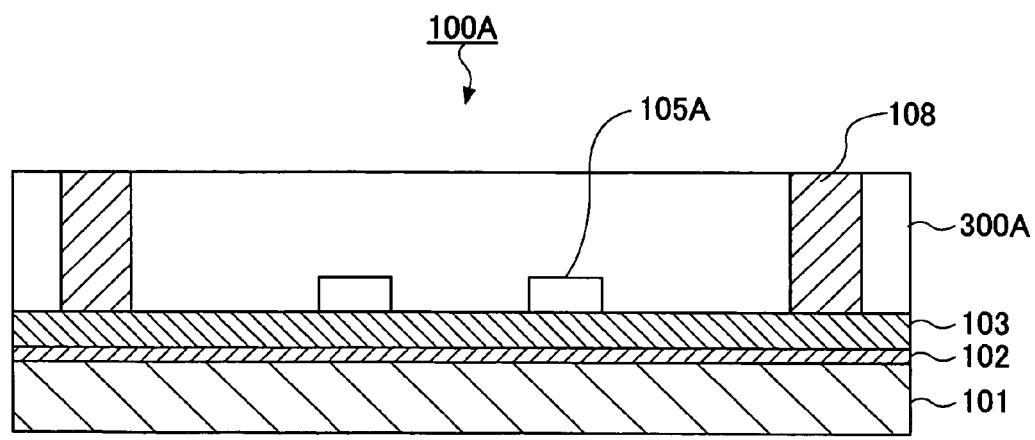
FIG. 5F is a diagram explaining a sixth process for forming the wiring structure according to the second embodiment.

In the second embodiment, in a process shown in FIG. 5F, an insulation layer 300A is formed by applying an underfill material in a manner so that the wiring structure composed of the plug wirings 105A and 108 and so on is covered with the underfill material. The insulation layer 300A functions as a dielectric inter layer that fills the space between the wiring structure and the semiconductor chip, after bonding the core substrates in a later process. As mentioned above, the forming method of the insulation layer becoming the dielectric inter layer can be changed.

By the above processes, a wiring structure formed substrate 100A is formed.

On the other hand, a semiconductor chip disposed substrate, in which a semiconductor chip is disposed, is formed by processes shown in FIGS. 6A through 6D.

Figure 6A:
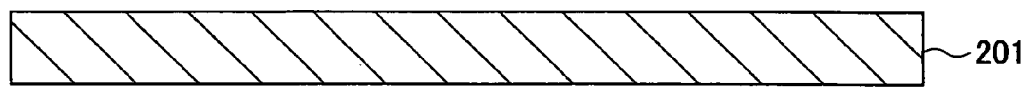
FIG. 6A is a diagram explaining a first process for forming a chip disposed substrate according to the second embodiment.
Figure 6B:
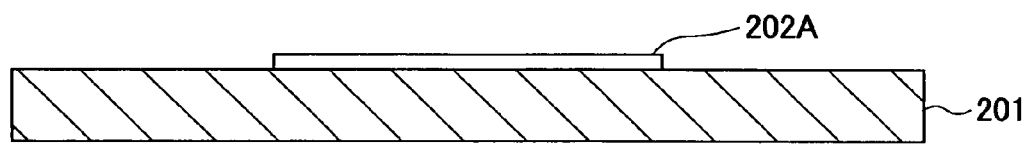
FIG. 6B is a diagram explaining a second process for forming the chip disposed substrate according to the second embodiment.

First, a process shown in FIG. 6A is the same as the process shown in FIG. 3A. Next, in a process shown in FIG. 6B, in order to adjust the disposing height of a semiconductor chip which is disposed in a later process, a chip height adjusting layer 202A is formed on a core substrate 201. The chip height adjusting layer 202A corresponds to the chip height adjusting layer 202 shown in FIG. 3B of the first embodiment; however, in the second embodiment, as the chip height adjusting layer 202A, for example, a die-attach film is used. As mentioned above, various materials can be used for the chip height adjusting layer 202A.

Figure 6C:
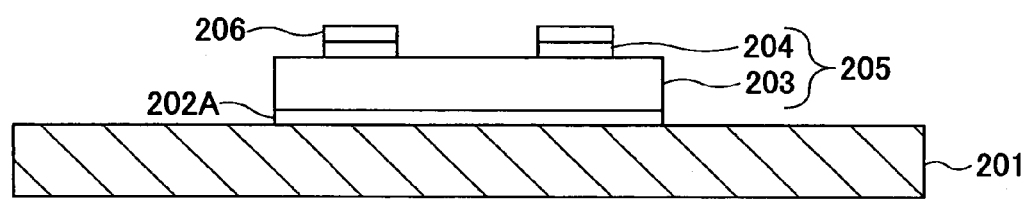
FIG. 6C is a diagram explaining a third process for forming the chip disposed substrate according to the second embodiment.

Next, in a process shown in FIG. 6C, a semiconductor chip 205, which provides a chip main body 203 and electrode pads 204 formed on the chip main body 203, is disposed on the chip height adjusting layer 202A. In this case, when the electrode pads 204 have a structure including a Ni bump, formed by, for example, an aluminum zincate material, its electric connection becomes good, and this is preferable. Further, in the second embodiment, a plating layer 206 made of, for example, Au, is formed on the electrode pads 204.

Figure 6D:
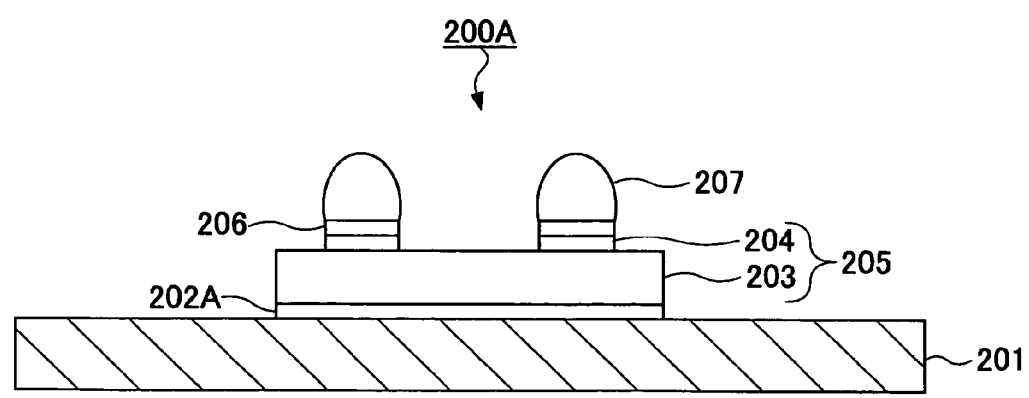
FIG. 6D is a diagram explaining a fourth process for forming the chip disposed substrate according to the second embodiment.

Further, in a process shown in FIG. 6D, a stud bump 207 made of, for example, Au is formed on the plating layers 206. The stud bumps 207 are deformed by being pressed between the plug wirings 105A and the electrode pads 204 of the semiconductor chip 205 in the bonding process of the core substrates being a later process. Therefore, the stud bumps 207 have a function that makes the electric connections between the plug wirings 105A and the electrode pads 204 good by this deformation.

By the above processes, a semiconductor chip disposed substrate 200A, having a structure in which the semiconductor chip 205 is disposed on the core substrate 201 via the chip height adjusting layer 202A, is formed.

Figure 7A:
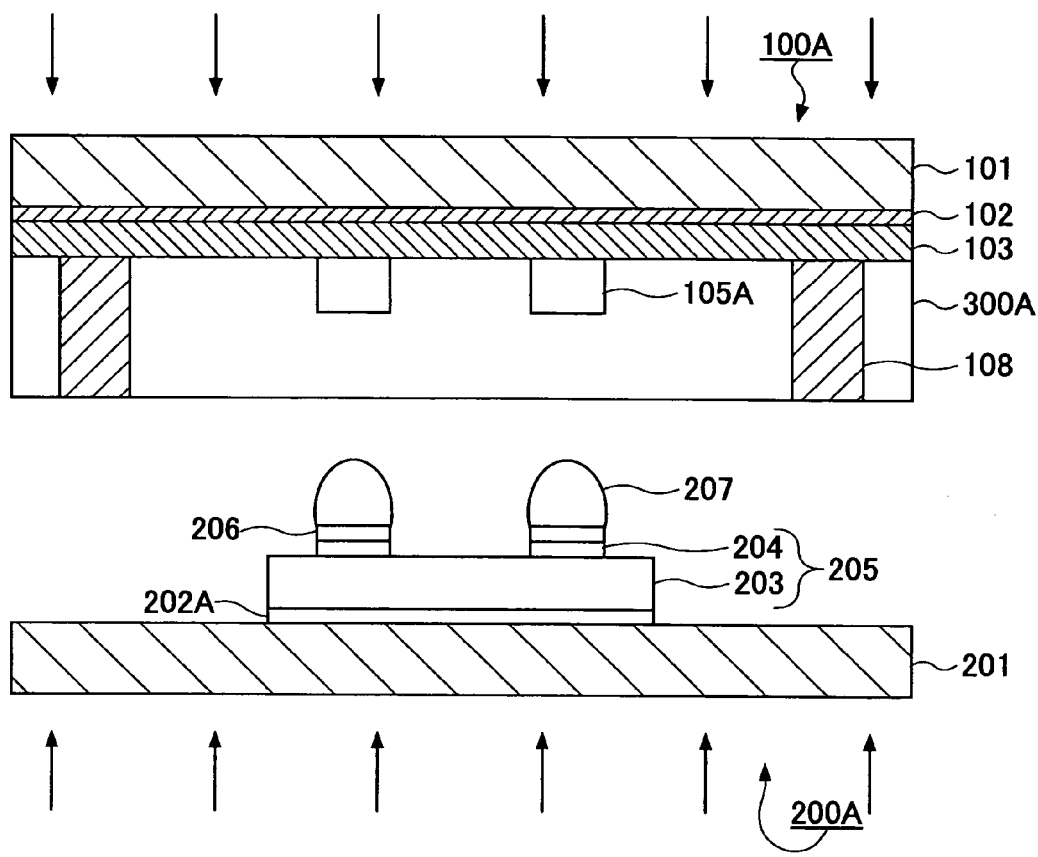
FIG. 7A is a diagram explaining a first process for forming a chip integrated substrate according to the second embodiment.
Figure 7B:
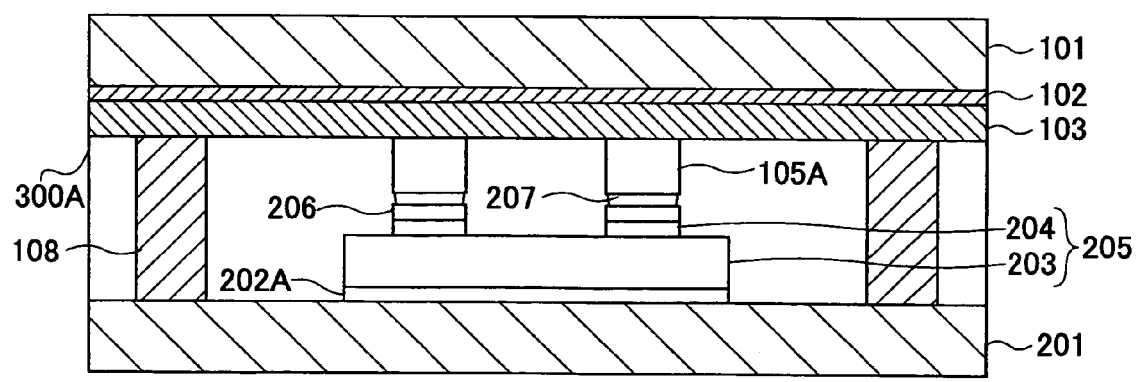
FIG. 7B is a diagram explaining a second process for forming the chip integrated substrate according to the second embodiment.

Next, in processes shown in FIGS. 7A and 7B, the wiring structure formed substrate 100A and the semiconductor chip disposed substrate 200A are bonded; further, a chip integrated substrate is completed by using various processes, corresponding to necessity.

In a process shown in FIG. 7A, the wiring structure formed substrate 100A and the semiconductor chip disposed substrate 200A are bonded by a process similar to the process shown in the first embodiment. In this case, the stud bumps 207 on the plating layers 206 and the plug wirings 105A are pressed, the stud bumps 207 are deformed, and the electric connections between the electrode pads 204 and the plug wirings 105A are established.

In addition, after bonding the wiring structure formed substrate 100A and the semiconductor chip disposed substrate 200A, as shown in FIG. 7B, the insulation layer 300A becomes a dielectric inter layer formed around the semiconductor chip 205 and the wiring structure. In this case, like in the first embodiment, the ends of the plug wirings 108 extending away from the conductive layer 103 are formed to engage the core substrate 201.

In addition, in processes (not shown) after the process shown in FIG. 7B, like the processes after the processes shown in FIG. 4B in the first embodiment, a chip integrated substrate is formed.

In addition, the above materials are examples in the embodiments of the present invention, but the materials are not limited to those and various other materials can be used; further, the shape of the wiring structure can be changed.

According to the embodiments of the present invention, a manufacturing method of a chip integrated substrate being thin can be provided at a low cost.

Further, the present invention is not limited to these embodiments, but variations and modifications may be made without departing from the scope of the present invention.

The present invention is based on Japanese Priority Patent Application No. 2004-354172, filed on Dec. 7, 2004, with the Japanese Patent Office, the entire contents of which are hereby incorporated by reference.

What is claimed is:

1. A manufacturing method of a chip integrated substrate in which a semiconductor chip is integrated, comprising:
   a first step that forms a wiring structure to be connected to the semiconductor chip on a first core substrate;
   a second step that disposes the semiconductor chip on a second core substrate; and
   a third step that bonds the first core substrate on which the wiring structure is formed to the second core substrate on which the semiconductor chip is disposed,
   wherein the first step includes:
      a conductive-layer forming step that forms conductive layers on the first core substrate; and
      a plug-wiring forming step that forms a plurality of plug wirings on one of the conductive layers,
   wherein the plurality of plug wirings, formed on said one of the conductive layers in the plug-wiring forming step of the first step, include first plug wirings which are connected to electrode pads of the semiconductor chip and second plug wirings which are connected to outside terminals.

2. The manufacturing method of the chip integrated substrate as claimed in claim 1, further comprising:
   a step that removes the first core substrate after the third step.

3. The manufacturing method of the chip integrated substrate as claimed in claim 1, further comprising:
   a step that removes the second core substrate after the third step.

4. The manufacturing method of the chip integrated substrate as claimed in claim 1, wherein
   the electrode pads of the semiconductor chip and the first plug wirings are pressed together and are electrically connected in the third step.

5. The manufacturing method of the chip integrated substrate as claimed in claim 4, wherein
   solder layers or stud bumps are formed between the electrode pads and the first plug wirings.

6. The manufacturing method of the chip integrated substrate as claimed in claim 4,
   wherein the second plug wirings have a height which is greater than that of the first plug wirings.

7. The manufacturing method of the chip integrated substrate as claimed in claim 1, further comprising:
   a step that laminates an insulation layer on the first core substrate or the second core substrate before the third step.

8. The manufacturing method of the chip integrated substrate as claimed in claim 1, further comprising:
   a step that applies an underfill material as a coating on the first core substrate before the third step.

9. The manufacturing method of the chip integrated substrate as claimed in claim 1, wherein
   the semiconductor chip is disposed on the second core substrate via a chip height adjusting layer.

10. The manufacturing method of the chip integrated substrate as claimed in claim 1, further comprising:
   a step that forms first terminal connecting sections on the one of the conductive layers and second terminal connecting sections on one of the plural plug wirings via a plating layer, in order that the wiring structure is electrically connected to outside terminals.

* * * * *